United States Patent [19]

McCabe et al.

[11] Patent Number: 4,593,253

[45] Date of Patent: Jun. 3, 1986

[54] FLIP-FLOP PHASE DETECTOR CIRCUIT FOR PHASE LOCKED LOOP

[75] Inventors: David J. McCabe; Geoffrey W. Sumerling, both of Northampton, England

[73] Assignee: Plessey Overseas Limited, Ilford, England

[21] Appl. No.: 655,695

[22] Filed: Sep. 28, 1984

[30] Foreign Application Priority Data

Oct. 29, 1983 [GB] United Kingdom ................. 8328951

[51] Int. Cl.⁴ ........................ H03D 13/00; H03L 7/08
[52] U.S. Cl. .................................. 331/1 A; 307/516; 328/133; 331/17; 331/25
[58] Field of Search ...................... 331/1 A, 17, 25, 27; 328/133, 134; 307/516, 526

[56] References Cited

U.S. PATENT DOCUMENTS 3,383,619 5/1968 Naubereit et al. ................. 331/27 X
4,128,811 12/1978 Englund, Jr. ..................... 328/134

*Primary Examiner*—Siegfried H. Grimm
*Attorney, Agent, or Firm*—Fleit, Jacobson, Cohn & Price

[57] ABSTRACT

A phase detecting arrangement includes an edge-triggered flip-flop phase detector which produces alternate logic 1 and logic 0 outputs in response to the arrival at respective detector inputs of set and re-set pulse transitions. These pulse transitions occur in pulse trains derived respectively, from external synchronizing signal generating means and a voltage-controlled oscillator the frequency of which is to be synchronized with that of the synchronizing signal. First and second sampling devices are associated with the phase detector for sampling the output from the detector when set and re-set transitions occur at inputs to the first and second sampling devices. Outputs from the sampling devices are suitably gated to produce an overall logic 1 or logic 0 output from the arrangement whereby an existing output from the arrangement is perpetuated when the phase detector output sampled indicates that at least two consecutive set or re-set pulse transitions have occurred without the intervention of an opposite type transition.

4 Claims, 6 Drawing Figures

FLIP-FLOP PHASE DETECTOR CIRCUIT FOR PHASE LOCKED LOOP

This invention relates to phase detecting arrangements for use in frequency and phase synchronising systems such as for clock pulse synchronisation in data transmission systems and line and frame signal synchronisation in television applications.

In one frequency and phase synchronising arrangement for synchronising the output signal from a voltage-controlled oscillator (VCO) with a synchronising signal of known frequency a phase detector serves to compare the frequency and phase of the oscillator output with the synchronising signal and to apply a control signal of appropriate sense and duration to a control loop of the oscillator for correcting any deviation of the oscillator from the synchronising signal and thus effect frequency and phase locking.

The phase detector may comprise solid state edge-triggered switching (e.g. flip-flop) means conveniently arranged to be triggered by the leading edges (i.e. positive or negative-going transitions) of synchronising signal pulses (hereinafter referred to as "set" pulses) in order to produce a first type output signal (e.g. logic 1) for application to the oscillator over the control loop and to be triggered by the leading edges (i.e. positive or negative-going transitions) of the oscillator output pulses (hereinafter referred to as "reset" pulses) in order to effect a change in the phase detector output from the first type output (e.g. logic 1) to a second type output (e.g. logic 0). However, it will be appreciated that a change in phase detector output from logic 1 to logic 0 will only take place when a reset pulse transition directly follows a set pulse transition whereas a change in phase detector output from logic 0 to logic 1 will only occur when a set pulse transition directly follows a reset pulse transition.

The phase detector output which is applied to the control loop of the voltage-controlled oscillator causes the oscillator to lock to the frequency of the synchronising signal but 180° out of phase therewith.

By way of explanation of this frequency and phase locking action, if the frequency of the oscillator is higher than the frequency of the synchronising signal then there will be a greater number of reset pulse transitions tending to produce logic 0 outputs than set pulse transitions producing logic 1 outputs. Consequently, the mean level of the phase detector output will be predominantly but decreasingly logic 0 so as to decrease the frequency of the oscillator until it reaches that of the synchronising signal at which phase locking occurs due to a zero mean phase detector output (i.e. the number and duration of logic 1 and logic 0 outputs is the same) with the leading edge of each set pulse being spaced midway between the leading edges of consecutive reset pulses. Conversely, when the oscillator frequency is lower than the synchronising signal frequency the number of reset pulse transitions will be lower than the number of set pulse transitions and consequently the mean level of the phase detector output which will be predominantly logic 1 will cause the oscillator to increase its output frequency to that of the synchronising signal.

The phase detector is so arranged that the unwanted loss or addition of a set pulse transition, such as due to noise, will result in a once-only extension of a logic 0 or logic 1 phase detector output, as the case may be, but this should not give rise to loss of phase lock or cycle slippage since a transient false phase error will arise after the event which will be recovered in succeeding cycles rather than increasing in succeeding cycles until the error reaches a whole cycle (i.e. cycle slippage) as occurs with some phase detectors.

These edge-triggered switching means, however, do suffer from the following disadvantages:

(a) Internal delays cause mis-operation of the switching means when certain phase and frequency relationships obtain between the set and reset pulse inputs to the phase detector and spurious phase lock results.

(b) The mean output (error signal) from the phase detector becomes decreasingly small for certain phase and frequency relationships. The presence of certain tolerances in the components of the oscillator control loop may mask small error signals and thus cause spurious lock to again occur.

The present invention is directed to overcoming the above disadvantages.

According to the present invention there is provided for use in a frequency and phase synchronising system a phase detecting arrangement comprising a phase detector having an inherent delay characteristic and arranged to produce alternate logic 1 and logic 0 outputs in response to the arrival at respective phase detector inputs of set and reset pulse transitions occurring in pulse trains derived, respectively, from external synchronising signal generating means and signal source means the frequency of which is to be synchronised with that of the synchronising signal, in which first and second sampling devices are associated with the phase detector for directly or indirectly sampling the output from the detector when set and reset transitions occur, respectively, at inputs to the first and second sampling devices and in which outputs from the sampling devices are suitably gated to produce an overall logic 1 or logic 0 output from the synchronising arrangement whereby an existing output (i.e. logic 1 or logic 0) from the arrangement is perpetuated when the phase detector output sampled indicates that at least two consecutive set or reset pulse transitions have occurred without the intervention of an opposite-type transition (i.e. reset or set).

Since the phase detector has an inherent delay the sampling devices effectively sample the phase detector output which obtains just prior to the set and reset pulse transitions and by effectively perpetuating the appropriate output from the synchronising arrangement the aforesaid mis-operation which can occur in known phase detectors due to close proximity set and reset pulse transitions can be avoided.

By way of example the present invention will now be described with reference to the accompanying drawings in which.

Figure 1:
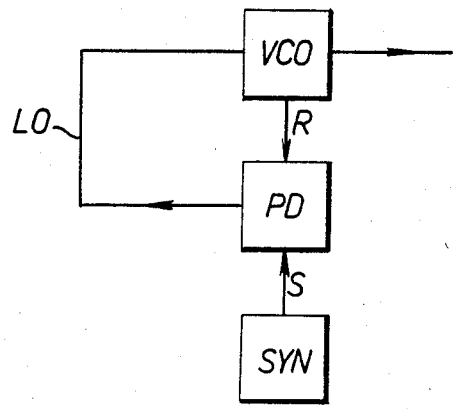
FIG. 1 shows a block diagram of a conventional frequency and phase synchronising system for a voltage-controlled oscillator.

Referring to FIG. 1 of the drawings the conventional frequency and phase synchronising system shown comprises a voltage-controlled oscillator VCO the frequency of which is arranged to be synchronised with that of a synchronising signal derived from signal generating means SYN. The output R from the oscillator VCO is compared with the synchronising signal S by a phase detector PD. The phase detector PD accordingly produces a varying output over the oscillator control loop LO which causes the oscillator to increase or decrease the frequency of its output. The phase detector PD commonly comprises a so-called edge-triggered reset/set flip-flop device the operation of which can readily be understood from a consideration of the pulse diagram shown in FIG. 2.

Figure 2:
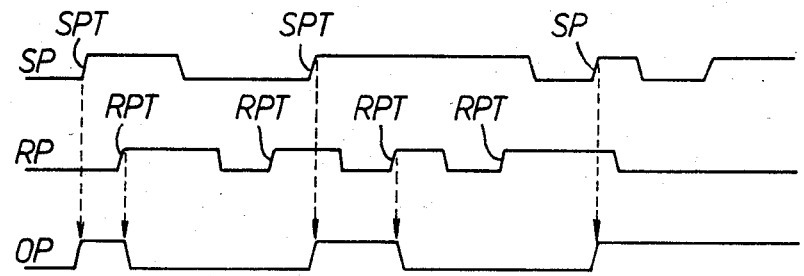
FIG. 2 is a pulse diagram showing the pulse inputs to the phase detector of the system of FIG. 1.
Figure 3:
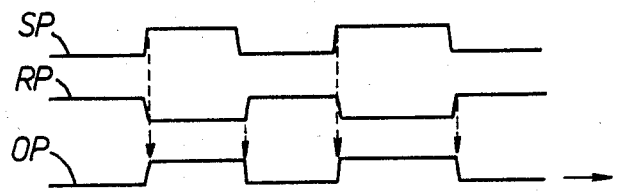
FIG. 3 shows the relative positions of the pulse inputs to and the pulse output from the phase detector of FIG. 1 when phase locking of the oscillator is achieved.

Referring to FIG. 2 the synchronising signal S comprises pulses applied to the phase detector which are referred to as "set" pulses SP whereas the oscillator output R applied to the phase detector PD comprises pulses referred to as "reset" pulses RP. The phase detector PD comprises an edge-triggered reset/set flip-flop device which is constructed so that it responds to the arrival of leading edges of set pulses SP (hereinafter referred to as set pulse transitions SPT) to produce or to prolong an already existing logic 1 output OP from the device. However, leading edges of reset pulses (hereinafter referred to as reset pulse transitions RPT) arriving at the phase detector cause a logic 1 output OP from the phase detector PD to be terminated or a logic 0 output OP to be maintained, as the case may be. A logic 1 detector output applied to the loop oscillator over the control loop LO causes the frequency of the oscillator to be increased whereas a logic 0 output produces a reduction in the oscillator frequency. When synchronisation is achieved between the oscillator frequency and the frequency of the synchronising signal the oscillator VCO will become phase-locked to the synchronising signal. This phase-locked condition is depicted in FIG. 3 where it can be seen that the alternate logic 1 and logic 0 outputs OP are of equal duration.

Figure 4:
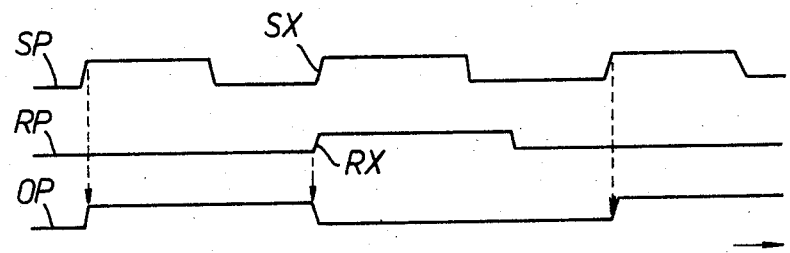
FIG. 4 illustrates mis-operation of the phase detector of the system of FIG. 1 when a particular positional relationship is assumed between phase detector input pulse trains.

As previously mentioned, one of the problems with such phase detectors PD is that mis-operation can occur due to certain positional relationships existing between the set and reset pulse transitions. For example, by referring to FIG. 4 which illustrates such mis-operation it can be seen that due to the close proximity of the set and reset pulse transitions SX and RX, the set pulse transition just fails to prolong the logic 1 output OP due to the almost simultaneous intervention of the reset pulse transition which causes the output OP to change to logic 0. Consequently, the output OP should be a logic 1 output whereas in fact it is a logic 0. Such mis-operation which tends to be cumulative can in some applications (e.g. in the synchronisation of clock pulses in data streams) be serious due to the incorrect data being read out at the data receiver.

The present invention overcomes this problem by the immediate sampling of the output from the flip-flop device PD at the instant when the aforesaid set and reset pulse transitions arrive at the phase detector. Due to the inherent time delay of the phase detector a sampled output (i.e. logic 1 or logic 0) is effectively that output which obtains immediately prior to the arrival of the set and reset pulse transitions.

Figure 5:
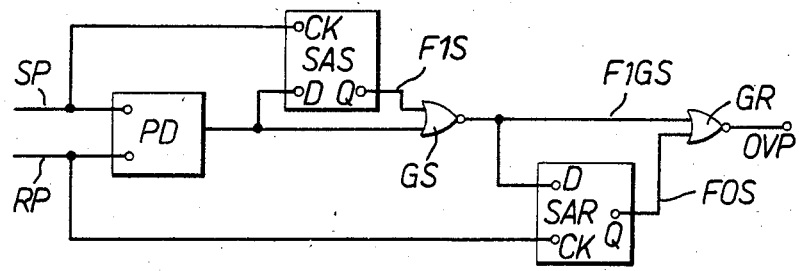
FIG. 5 shows a phase detecting arrangement according to the present invention.

Referring now to FIG. 5 of the drawing this shows a phase detecting arrangement according to the invention.

Figure 6:
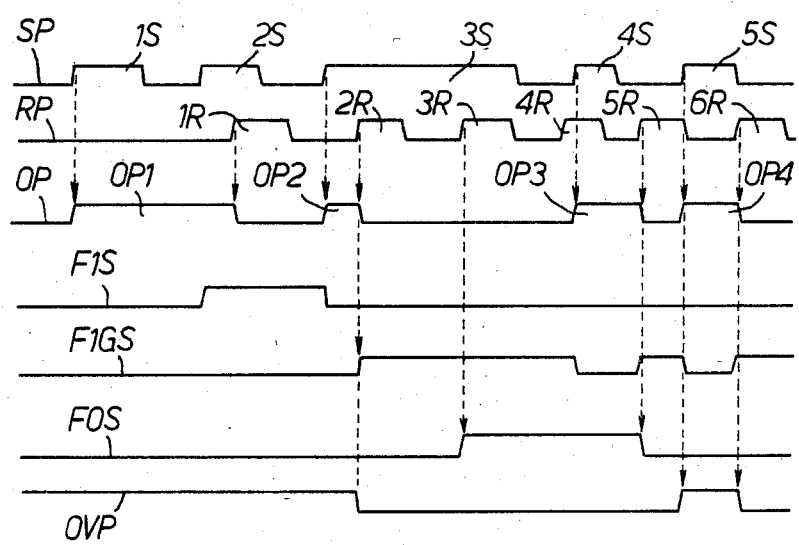
FIG. 6 shows various pulse input and output waveforms to and from the arrangement shown in FIG. 5.

The phase detector PD may comprise an edge-triggered reset-set flip-flop device as embodied in the FIG. 1 arrangement. However, in the present arrangement the output OP from the flip-flop device PD is sampled by two sampling devices SAS and SAR. As can be seen, the sampling device SAS directly samples the detector output OP at input terminal D each time a set pulse transition occurs at input terminal CK. As previously mentioned, the sampled output OP is effectively that which obtains just prior to the occurrence of each set transition. Referring now to FIG. 6 it can be seen that if the output OP sampled by the device SAS is a logic 0, as will occur when the last previous pulse transition has been a reset pulse transition (e.g. set pulse transition of set pulse 3S following reset pulse transition of reset pulse 1R) then the sampling device SAS either terminates (as shown) or in any event does not produce, a so-called Force 1 signal F1S at its output. However, if the output OP sampled is logic 1 which would indicate the arrival of a second or further consecutive set pulse transition without an intervening reset pulse transition (e.g. set pulse transition of pulse 2S following set pulse transition of pulse 1S without intervention of a reset pulse transition) then a Force 1 signal F1S will be produced at the output of the sampling device SAS. This Force 1 signal F1S persists until the occurrence of the next set pulse transition after the intervention of a reset pulse transition (e.g. set pulse transition of pulse 3S following intervention of reset pulse transition of reset pulse 1R). The Force 1 signal F1S is applied to one input of a NOR gate GS the other input being the output OP from the detector device PD. As can be seen from the pulse drawing of FIG. 6 the gate GS provides a logic 1 output only when both the output OP and Force 1 signal are logic 0. The output from the gate GS is applied as one input to another NOR gate GR which also receives an input from the sampling device SAR which effectively samples the phase detector output OP which obtains immediately prior to the occurrence of reset pulse transitions as follows. When the output OP is logic 1 the Force 1 gate signal is always logic 0. By referring to FIG. 6 it can be seen that the Force 1 gate signal F1GS becomes logic 1, for example upon the occurrence of the reset pulse transition of reset pulse 2R, whereupon output pulse OP2 (logic 1) is terminated so that output OP is logic 0. Upon the occurrence of the further reset pulse transition of reset pulse 3R without the intervention of a set pulse transition the sampling device SAR produces a logic 1 Force 0 signal FOS and this logic 1 signal continues until after the Force 1 gate signal F1GS has become logic 0 and is sampled by sampling unit SAR upon the occurrence of reset pulse transition of reset pulse 5R. The Force 0 signal then becomes logic 0 as shown. The Force 1 gate signal F1GS and Force 0 signal FOS are applied to the NOR gate GR and this gate only provides a logic 1 output when the Force 1 gate signal F1GS and the Force 0 signal FOS are logic 0. Thus it can be seen that the overall output signal OVP from the arrangement according to the invention takes into account the occurrence of consecutive set pulse transitions and consecutive reset pulse transitions in order to perpetuate the existing overall output appropriate to the input pulse trains to the arrangement by effectively sampling the phase detector output immediately prior to the set and reset pulse transitions whereby the mis-operation of the arrangement due to the close proximity of set and reset pulse transitions as previously described with reference to FIG. 1 of the drawings can be effectively avoided.

As in the case of the conventional synchronising system described with reference to FIG. 1 the logic 1 output OVP of FIGS. 5 and 6 may be applied to an oscillator control loop to cause the frequency of the oscillator to increase until it reaches the synchronising frequency at which phase lock occurs whereas a logic 0 output OVP will cause the frequency of the oscillator to be decreased until parity between the oscillator frequency and synchronising signal is reached whereupon phase lock will again occur.

What we claim is:

1. A phase detecting arrangement for use in a frequency and phase synchronising system, said arrangement comprising a phase detector having an inherent delay characteristic and arranged to produce alternate logic 1 and logic 0 outputs in response to the arrival at respective phase detector inputs of set and re-set pulse transitions occurring in pulse trains derived, respectively, from external synchronising signal generating means and signal source means the frequency of which is to be synchronised with that of the synchronising signal, in which first and second sampling devices are associated with the phase detector for sampling the output from the detector when set and re-set transitions occur, respectively, at inputs to the first and second sampling devices and in which outputs from the sampling devices are suitably gated to produce an overall logic 1 or logic 0 output from the arrangement whereby an existing output (i.e. logic 1 or logic 0) from the arrangement is perpetuated when the phase detector output sampled indicates that at least two consecutive set or re-set pulse transitions have occurred without the intervention of an opposite type transition (i.e. re-set or set).

2. A phase detecting arrangement as claimed in claim 1, in which the phase detector comprises an edge-triggered reset-set flip-flop device.

3. A phase detecting arrangement as claimed in claim 1, in which the output (FORCE 1SIGNAL) from the first sampling device and the output (OP) from the phase detector are applied to a NOR gate the output (FORCE 1 GATE SIGNAL) from which and the output (FORCE 0 SIGNAL) from the second sampling device which has the output from the said NOR gate as one of its inputs are applied to a second NOR gate the output (OVP) from which constitutes the overall output from the phase detecting arrangement.

4. A phase detecting arrangement as claimed in claim 1, in which the inputs to the phase detector are derived from a voltage-controlled oscillator and the synchronising signal generating means, respectively, and in which the output from the arrangement is applied to the control loop of the oscillator.

* * * * *